United States Patent [19]
Kobayashi et al.

[11] Patent Number: 5,415,955
[45] Date of Patent: May 16, 1995

[54] STRUCTURE FOR HOLDING A BATTERY PACK ON AN ELECTRONIC APPARATUS

[75] Inventors: Fumiyuki Kobayashi, Tokyo; Hironori Kawaji, Saitama, both of Japan

[73] Assignee: NEC Corporation, Tokyo, Japan

[21] Appl. No.: 310,075

[22] Filed: Sep. 22, 1994

[30] Foreign Application Priority Data

Sep. 24, 1993 [JP] Japan .................................. 5-237098

[51] Int. Cl.⁶ .................................................. H01M 2/10
[52] U.S. Cl. ........................................ 429/97; 429/100
[58] Field of Search .............................. 429/96–100, 429/123, 9; 361/334, 391, 394; 307/150

[56] References Cited

U.S. PATENT DOCUMENTS

| | | | |
|---|---|---|---|
| 4,842,966 | 6/1989 | Omori et al. | 429/96 |
| 4,943,498 | 7/1990 | Cooper et al. | 429/97 |
| 5,019,465 | 5/1991 | Herron et al. | 429/97 |
| 5,293,109 | 3/1994 | Fischl et al. | 429/97 X |

Primary Examiner—Anthony Skapars
Attorney, Agent, or Firm—Sughrue, Mion, Zinn, Macpeak & Seas

[57] ABSTRACT

An electronic apparatus has a first and a second engaging portion. After the first engaging portion has mated with a hook portion included in a battery pack, the battery pack is pressed against the casing of the apparatus. As a result, a lock lever extending from the battery pack bends in a first direction and mates with the second locking portion. A wall portion is formed in the battery pack outboard of the lock lever and provided with adequate strength and elasticity. The wall portion protects the lock lever from damage when an excessive force, tending to bend the lock lever in a second direction opposite to the first direction, acts on the lever.

4 Claims, 1 Drawing Sheet

STRUCTURE FOR HOLDING A BATTERY PACK ON AN ELECTRONIC APPARATUS

BACKGROUND OF THE INVENTION

The present invention relates to a structure for removably holding a battery pack on an electronic apparatus and, more particularly, to a structure for holding a battery pack accommodating batteries which power a portable telephone or similar miniature electronic apparatus.

It has been customary with an electronic apparatus of the kind described to provide the casing of the apparatus with a first and a second engaging portion while providing a battery pack with a hook portion and a lock lever. The hook portion is engageable with the first engaging portion. The lock lever is made of a plastic or similar elastic material and engageable with the second engaging portion. To mount the battery pack to the casing, the former is pressed against the latter. As a result, the lock lever elastically bends and mates with the second engaging portion of the casing, locking the battery pack to the casing. To remove the battery pack from the casing, the lock lever is bent by finger until it has been released from the second engaging portion.

The conventional structure relies on the elasticity of the lock lever in locking and unlocking the battery pack from the casing of the apparatus, as stated above. The problem with such a structure is that the lock lever breaks when bent beyond the limit of elasticity thereof, as determined by experiments.

SUMMARY OF THE INVENTION

It is, therefore, an object of the present invention to provide a battery pack holding structure for an electronic apparatus which protects a lock lever from damage even when an excessive force, tending to bend the lever outward, acts on the lever.

In accordance with the present invention, a structure for removably holding on the casing of an electronic apparatus a battery pack which accommodates batteries for feeding power to the electronic apparatus has a first and a second flat engaging portion extending from the casing in opposite directions for locking the battery pack in a longitudinal direction. A hook portion is provided on one end of the battery pack with respect to the longitudinal direction for mating with the first engaging portion. An elastic lock lever extends from the other end of the battery pack with respect to the longitudinal direction for mating with the second engaging portion due to elasticity when the pack is pressed against the casing after the first engaging portion and hook portion have mated with each other, thereby locking the pack to the casing. A wall portion extends from the battery pack outboard of the lock lever for protecting the lever from damage when an excessive force, tending to bend the lever outward, acts on the lever.

In the above structure, the wall portion prevents the lock lever from bending excessively against the excessive force tending to bend the lever outward.

BRIEF DESCRIPTION OF THE DRAWINGS

The above and other objects, features and advantages of the present invention will become more apparent from the following detailed description taken with the accompanying drawings in which.

DESCRIPTION OF THE PREFERRED EMBODIMENT

Figure 1:
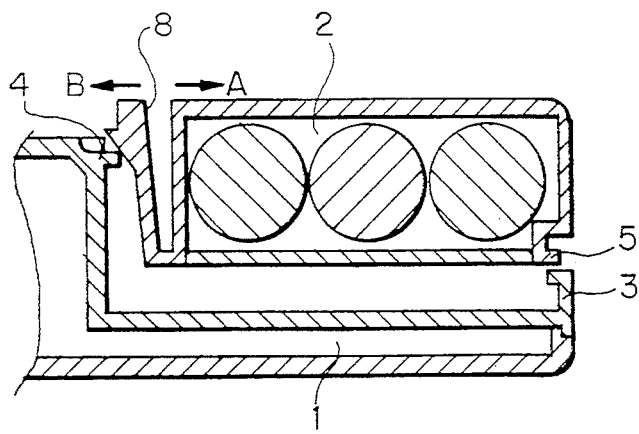
FIG. 1 is a section showing a conventional battery pack holding structure for an electronic apparatus.

To better understand the present invention, a brief reference will be made to a conventional structure for holding a battery pack, shown in FIG. 1. As shown, an electronic apparatus has a casing 1 to which a battery pack 2 is removably mounted. The casing 1 has a first engaging portion 3 and a second engaging portion 4. The battery pack 2 has a hook portion 5 and a lock lever 8. The hook portion 5 is engageable with the first engaging portion 3. The lock lever 8 is made of a plastic or similar elastic material and engageable with the second engaging portion 3. To mount the battery pack 2 to the casing 1, the former is pressed against the latter. Then, the lock lever 8 elastically bends in a direction A and with the second engaging portion 4 of the casing 1, locking the battery pack 2 to the casing 1. To remove the battery pack 2 from the casing 1, the lock lever 8 is bent in the direction A by finger until it has been released from the second engaging portion 4.

The conventional structure described above has a problem that the lock lever 8 of the battery pack 2 is apt to break, as stated earlier.

Figure 2:
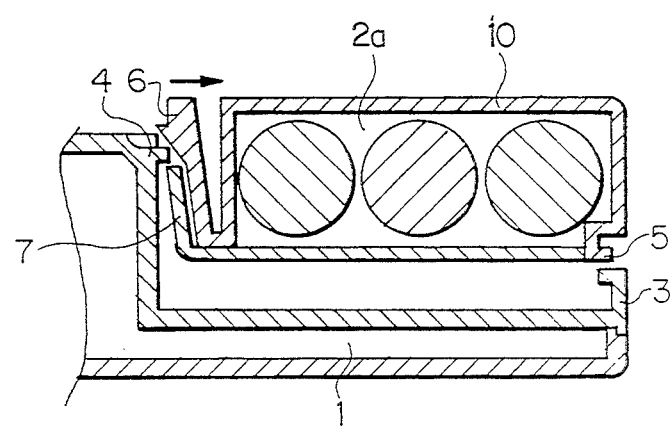
FIG. 2 is a section showing a battery pack holding structure embodying the present invention.

Referring to FIG. 2, a battery pack holding structure embodying the present invention will be described. As shown, a battery pack 2a is removably mounted to a casing 1 included in an electronic apparatus. The casing 1 has a first engaging portion 3 and a second engaging portion 4 which are engageable with the battery pack 2a. The battery pack 2a has a casing 10 accommodating nickel-cadmium batteries thereon. The casing 10 has a hook portion 5 and a lock lever 6 which are respectively engageable with the first and second engaging portions 3 and 4 of the casing 1. Further, the casing 10 has a wall portion 7 extending substantially parallel to the lock lever 6.

To mount the battery pack 2a to the casing 1, the hook portion 5 is brought into engagement with the first engaging portion 3. Subsequently, the battery pack 2a is pressed against the casing 1. As a result, the lock lever 6 of the battery pack 6 bends in a direction A and mates with the second engaging portion 4, thereby locking the battery pack 4a to the casing 1. To unlock the battery pack 2a from the casing 1, the lock lever 6 is bent in the direction A by finger so as to be released from the second engaging portion 4. In this condition, the battery pack 2a is ready to be removed from the casing 1.

Figure 3:
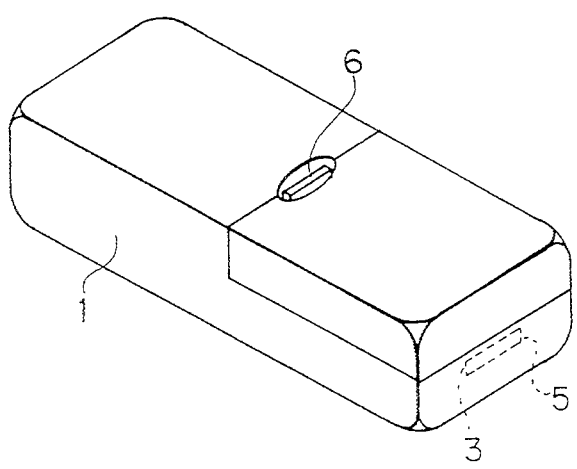
FIG. 3 is a perspective view of an electronic apparatus incorporating the structure of the present invention.

FIG. 3 is a rear view showing the battery pack holding structure in accordance with the present invention which is applied to a portable telephone by way of example. Dial keys and other conventional keys are arranged on the front of the telephone, although not shown in the figure.

Figure 4:
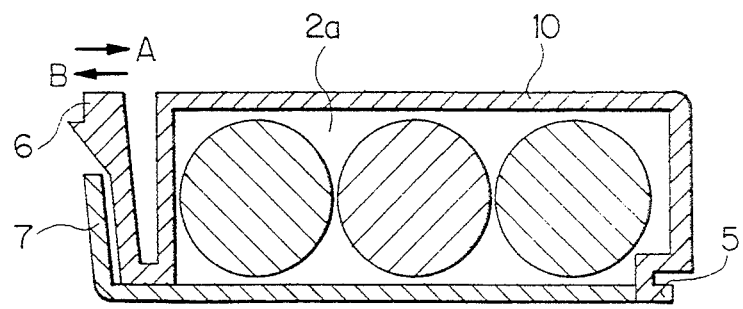
FIG. 4 is a section showing how an external force acts on a lock lever included in the embodiment.

FIG. 4 shows the battery pack 2a removed from the casing of the electronic apparatus. Even when the lock lever 6 is accidentally jerked in a direction B by, for example, being caught by the user's clothing, the wall 7 outboard of the lock lever 6 prevents it from bending.

When the lock lever 6 is in a direction A, the casing 10 of the battery pack 2a itself plays the role of a stop for preventing the lock lever 6 from bending. In this manner, the lock lever 6 is protected from damage even when subjected to unexpected external forces.

The electrical connection between the battery pack 2a and the electronic apparatus is not shown or described since it is not relevant to the understanding of the present invention.

Various modifications will become possible for those skilled in the art after receiving the teachings of the present disclosure without departing from the scope thereof.

What is claimed is:

1. A structure for removably holding on a casing of an electronic apparatus a battery pack which accommodates batteries for feeding power to said electronic apparatus, said structure comprising:

a first and a second flat engaging portion extending from said casing in opposite directions for locking said battery pack in a longitudinal direction;

a hook portion provided on one end of said battery pack in the longitudinal direction for mating with said first engaging portion;

an elastic lock lever extending from the other end of said battery pack with respect to the longitudinal direction for mating with said second engaging portion due to elasticity when said battery pack is pressed against said casing after said first engaging portion and said hook portion have mated with each other, thereby locking said battery pack to said casing; and a wall portion extending from said battery pack outboard of said lock lever for protecting said lock lever from damage when an excessive force, tending to bend said lock lever outward, acts on said lock lever.

2. A structure as claimed in claim 1, wherein said wall portion has strength and elasticity which prevent said lock lever from bending outward against the excessive force, while insuring engagement of said lock lever with said second engaging portion.

3. A structure for removably holding on a casing of an electronic apparatus a battery pack which accommodates batteries for feeding power to said electronic apparatus, said structure comprising:

an accommodating portion provided in said casing for accommodating said battery pack;

a first and a second engaging portion formed in said accommodating portion;

a hook portion formed in said battery pack for mating with said first engaging portion;

a swayable lock lever extending from said battery pack and terminating at a lug engageable with said second engaging portion; and member provided in said battery pack for limiting a swaying motion of said lock lever.

4. A structure as claimed in claim 3, wherein said lock lever comprises an elastic member made of a plastic.

* * * * *

UNITED STATES PATENT AND TRADEMARK OFFICE
CERTIFICATE OF CORRECTION

PATENT NO.    : 5,415,955
DATED         : May 16, 1995
INVENTOR(S)   : Fumiyuki Kobayashi and Hironori Kawaji It is certified that error(s) appears in the above-identified patent and that said Letters Patent is hereby corrected as shown below:

Column 1, Line 35, delete "t o" insert --to--.

Column 2, Line 25, after "and", insert --mates--

Signed and Sealed this

Twenty-second Day of August, 1995

Attest:

BRUCE LEHMAN

Attesting Officer        Commissioner of Patents and Trademarks